United States Patent [19]
Tajima

[11] Patent Number: 5,969,391
[45] Date of Patent: Oct. 19, 1999

[54] COMPLEMENTARY INSULATED-GATE FIELD-EFFECT TRANSISTORS HAVING IMPROVED ANTI-LATCHUP CHARACTERISTIC

[75] Inventor: Yutaka Tajima, Kanagawa, Japan

[73] Assignee: Nissan Motor Co., Ltd., Kanagawa, Japan

[21] Appl. No.: 08/867,764

[22] Filed: Jun. 3, 1997

[30] Foreign Application Priority Data

Jun. 3, 1996 [JP] Japan ..................................... 8-139912

[51] Int. Cl.$^6$ ........................... H01L 29/76; H01L 29/94; H01L 31/062; H01L 23/62
[52] U.S. Cl. ......................... 257/373; 257/369; 257/372; 257/355
[58] Field of Search ..................................... 257/369, 372, 257/373, 376, 375, 343, 355, 357

[56] References Cited

U.S. PATENT DOCUMENTS 4,616,243 10/1986 Minato et al. .......................... 257/373
4,683,488 7/1987 Lee et al. ................................ 257/372

FOREIGN PATENT DOCUMENTS 58-201353 11/1983 Japan ..................................... 257/369

OTHER PUBLICATIONS

RCJ Documents on 3rd EOS/ESD Symposium, Nov. 1993.

Primary Examiner—Steven H. Loke
Attorney, Agent, or Firm—McDermott, Will & Emery

[57] ABSTRACT

A semiconductor device includes an N-well arranged in the principal surface of a P-type semiconductor substrate, an N$^+$ well contact arranged in the principal surface of the N-well, and an N$^+$ buried region arranged to the bottom of the N-well.

13 Claims, 8 Drawing Sheets

COMPLEMENTARY INSULATED-GATE FIELD-EFFECT TRANSISTORS HAVING IMPROVED ANTI-LATCHUP CHARACTERISTIC

BACKGROUND OF THE INVENTION

The present invention relates generally to semiconductor devices and more particularly to complementary insulated-gate field-effect transistors (CMOSs).

One of the conventional semiconductor devices is disclosed, e.g. in JP-A 58-201353. This semiconductor device is constructed such that, when excessive surge or electrostatic discharge (ESD) voltage is applied to an input/output terminal, the existence of an $N^+$ buried region formed to the bottom of an N-well contributes to a reduction in the current amplification factor $h_{PE}$ of a PNP bipolar transistor, and a shunt resistance between the emitter and the base thereof. This results in restrained latchup so called.

However, the above semiconductor device has the following problems:

First, due to reduced capacity of the PNP bipolar transistor to bypass ESD current, ESD current is concentrated on one of the pull-up and pull-down diodes in a protective element, resulting in lowered breakdown strength of the semiconductor device with respect to ESD current;

Second, due to high-temperature annealing of the semiconductor device during a fabrication process, N-impurities within the $N^+$ buried region can be diffused in the upper portion thereof to increase the surface concentration of N-impurities in the N-well. This reduces breakdown voltage of a P-channel insulated-gate field-effect transistor (PchMOSFET) formed in the principal surface of the N-well, resulting in difficult control of a threshold value thereof; and Third, due to reduced on-resistance of a lateral power transistor formed in another N-well, the $N^+$ buried region cannot show sufficiently high concentration of N-impurities. If two $N^+$ buried regions are formed separately, the fabrication process of the semiconductor device will be complicated, resulting in increased manufacturing cost.

It is, therefore, an object of the present invention to provide semiconductor devices which show improved anti-latchup characteristic and sufficiently reduced on-resistance of a power transistor with cheaper manufacturing cost.

SUMMARY OF THE INVENTION

According to one aspect of the present invention, there is provided a semiconductor device, comprising:

a substrate of a first type, said substrate having a surface;

a first well of a second type, said first well being arranged in said surface of said substrate, said first well having a surface and a bottom;

a contact of said second type in a first state, said contact being arranged in said surface of said first well; and a first region of said second type in said first state, said first region being arranged in said bottom of said first well.

Another aspect of the present invention lies in providing a semiconductor device, comprising:

a substrate of a first type, said substrate having a surface;

a first well of a second type, said first well being arranged in said surface of said substrate, said first well having a surface and a bottom;

a contact of said second type in a first state, said contact being arranged in said surface of said first well;

a first region of said second type in said first state, said first region being arranged to said bottom of said first well;

a second well of said second type, said second well having a surface;

a transistor arranged on said surface of said second well, said transistor having a source, a gate, and a drain arranged on the same plane; and a second region of said second type in said first state, said second region being arranged to said bottom of said second well.

Still another aspect of the present invention lies in providing a semiconductor device comprising:

a semiconductor substrate of a first type;

a first well region of a second conductivity type arranged in the semiconductor substrate, said first well region having a bottom having a peripheral region and a central region;

a contact region of the second conductivity type arranged in the first well region and having an impurity concentration higher than that of the first well region;

a first metal oxide semiconductor (MOS) device of the second conductivity type formed in the first well region;

a first region of said second conductivity type having an impurity concentration higher than the first well region and arranged below the peripheral region of said first well region; and a second region being the semiconductor substrate of the first conductivity type and arranged below the central region.

DETAILED DESCRIPTION OF THE INVENTION

Figure 1A:
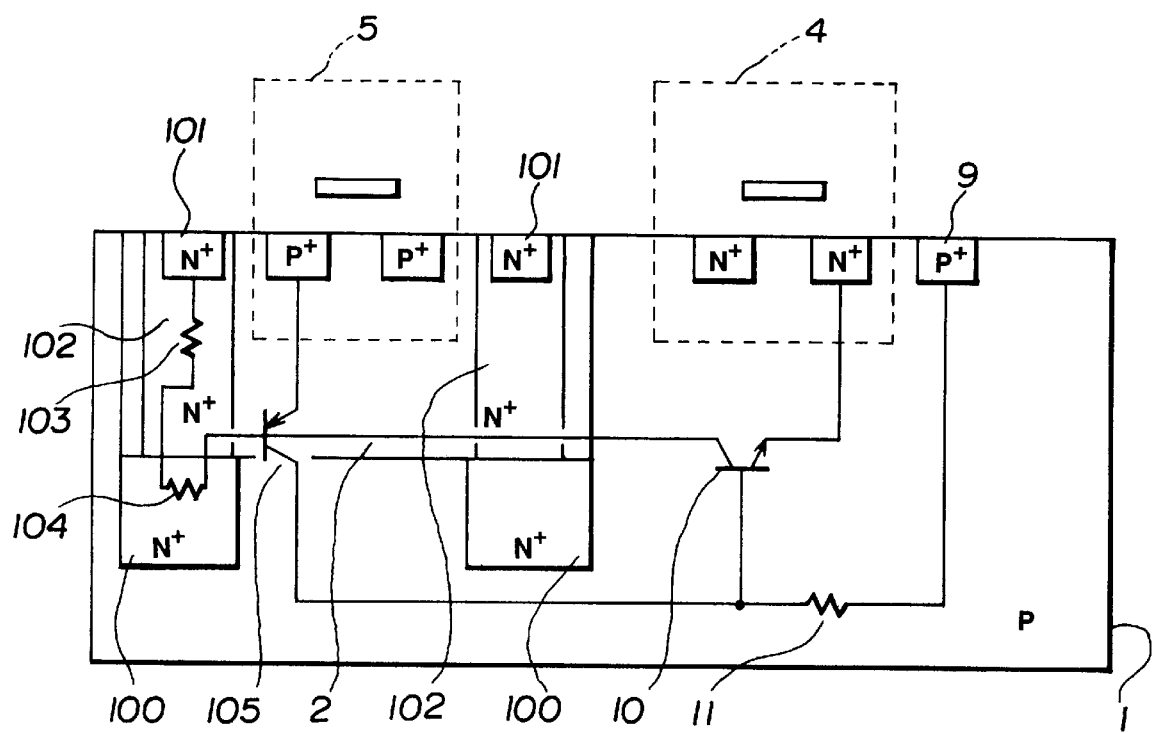
FIG. 1A is a diagrammatic sectional view showing a first embodiment of a semiconductor device according to the present invention.

Referring to the drawings wherein like reference numerals designate like parts throughout the views, semiconductor devices embodying the present invention will be described.

Figure 1B:
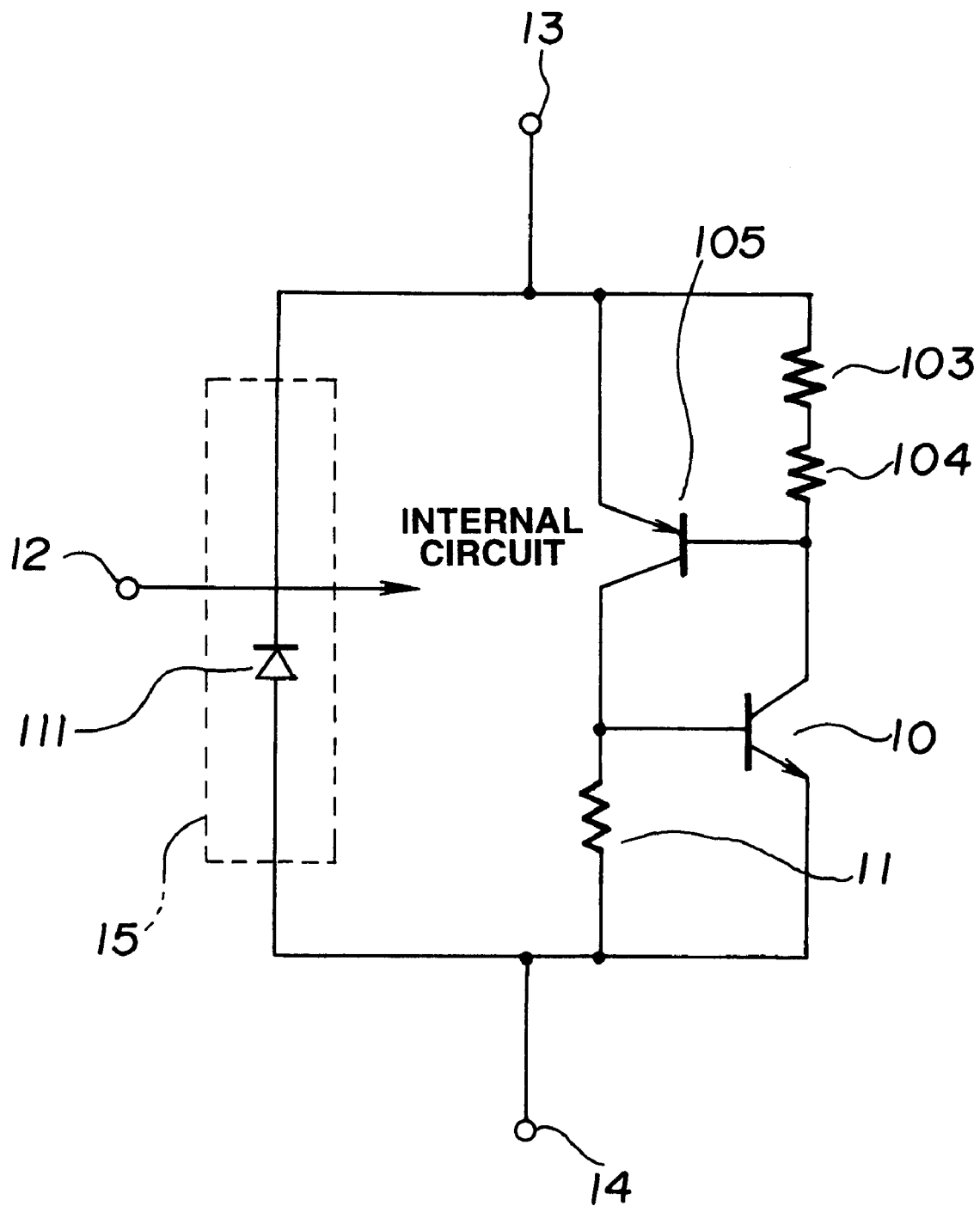
FIG. 1B is a diagram showing an equivalent circuit of the semiconductor device.
Figure 2:
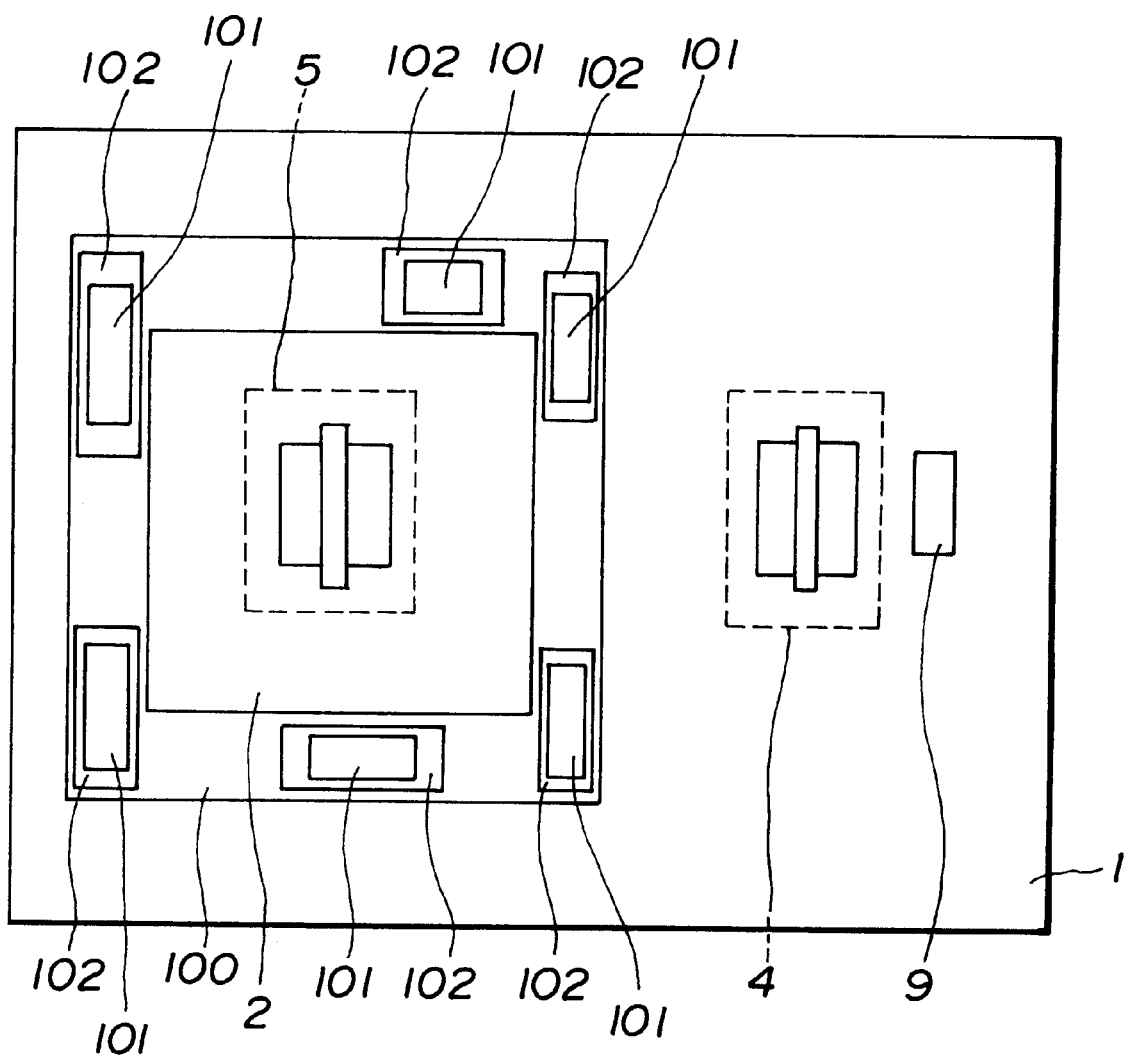
FIG. 2 is a plan view showing the semiconductor device.

FIGS. 1A–5 show a first embodiment of the present invention. Referring to FIGS. 1A and 2, a semiconductor device comprises an N-well 2 and a $P^+$ substrate contact 9 formed in a surface of a P-type semiconductor substrate 1. An N-channel insulated-gate field-effect transistor $N^+$ (NchMOSFET) 4 is arranged in the principal surface of the P-type semiconductor substrate 1, and a P-channel insulated-gate field-effect transistor (PchMOSFET) 5 is arranged in the principal surface of the N-well 2. An N+ buried region 100 is continuously formed at the ends of the bottom of the N-well 2. N+ well contacts 101 are arranged in part of the principal surface of the N-well 2, and N+ regions 102 are arranged each between the N+ well contact 101 and the N+ buried region 100. This forms an NPN bipolar transistor 10 having an emitter corresponding to the source of the NchMOSFET 4, a base corresponding to the P-type semiconductor substrate 1, and a collector corresponding to the N-well 2, and a PNP bipolar transistor 105 having an emitter corresponding to the source of the PchMOSFET 5, a base corresponding to the N-well 2, and a collector corresponding to the P-type semiconductor substrate 1.

A resistance 103 is a shunt resistance between the emitter and the base of the PNP bipolar transistor 105 in the N+ regions 102, and a resistance 104 is a shunt resistance between the emitter and the base of the PNP bipolar transistor 105 in the N+ buried region 100. Moreover, a resistance 11 is a shunt resistance between the emitter and the base of the NPN bipolar transistor 10. Referring to FIG. 1B, a parasitic thyrister comprising the PNP bipolar transistor 105, the NPN bipolar transistor 10, and the resistances 103, 104, 11 is connected between Vdd and Vss terminals 13, 14. A protective element 15 comprising a pull-down diode 111 is connected to an input/output terminal 12 and between the Vdd and Vss terminals 13, 14.

Figure 3:
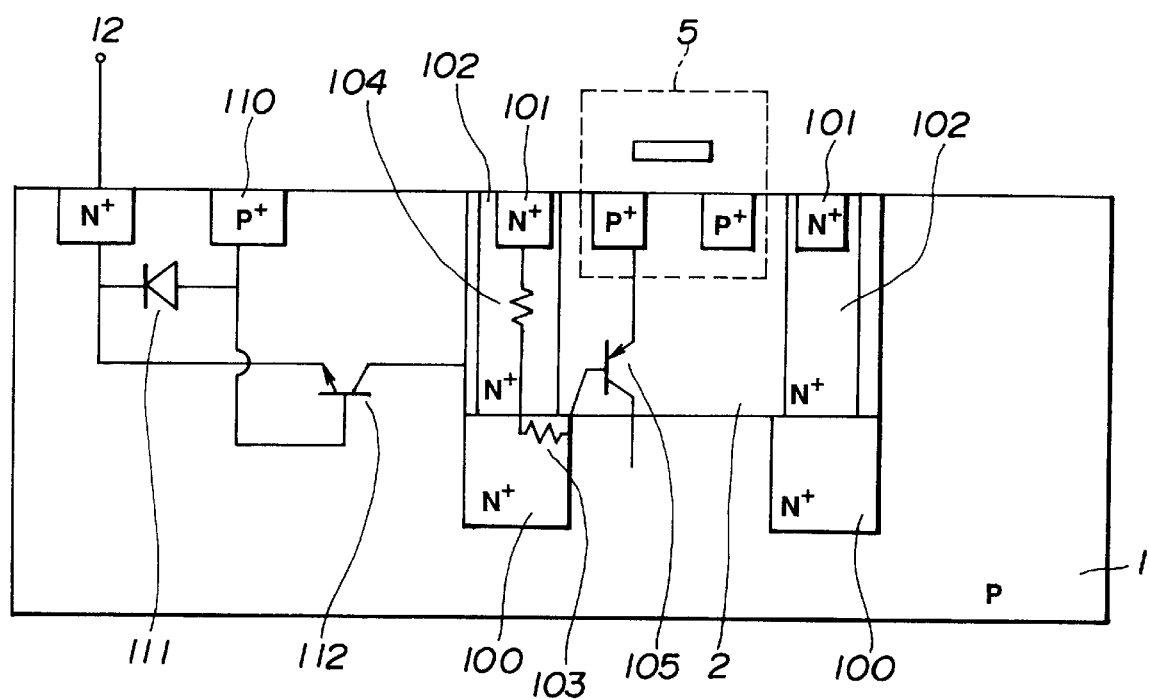
FIG. 3 is a view similar to FIG. 1, explaining a latchup phenomenon of the semiconductor device.
Figure 4:
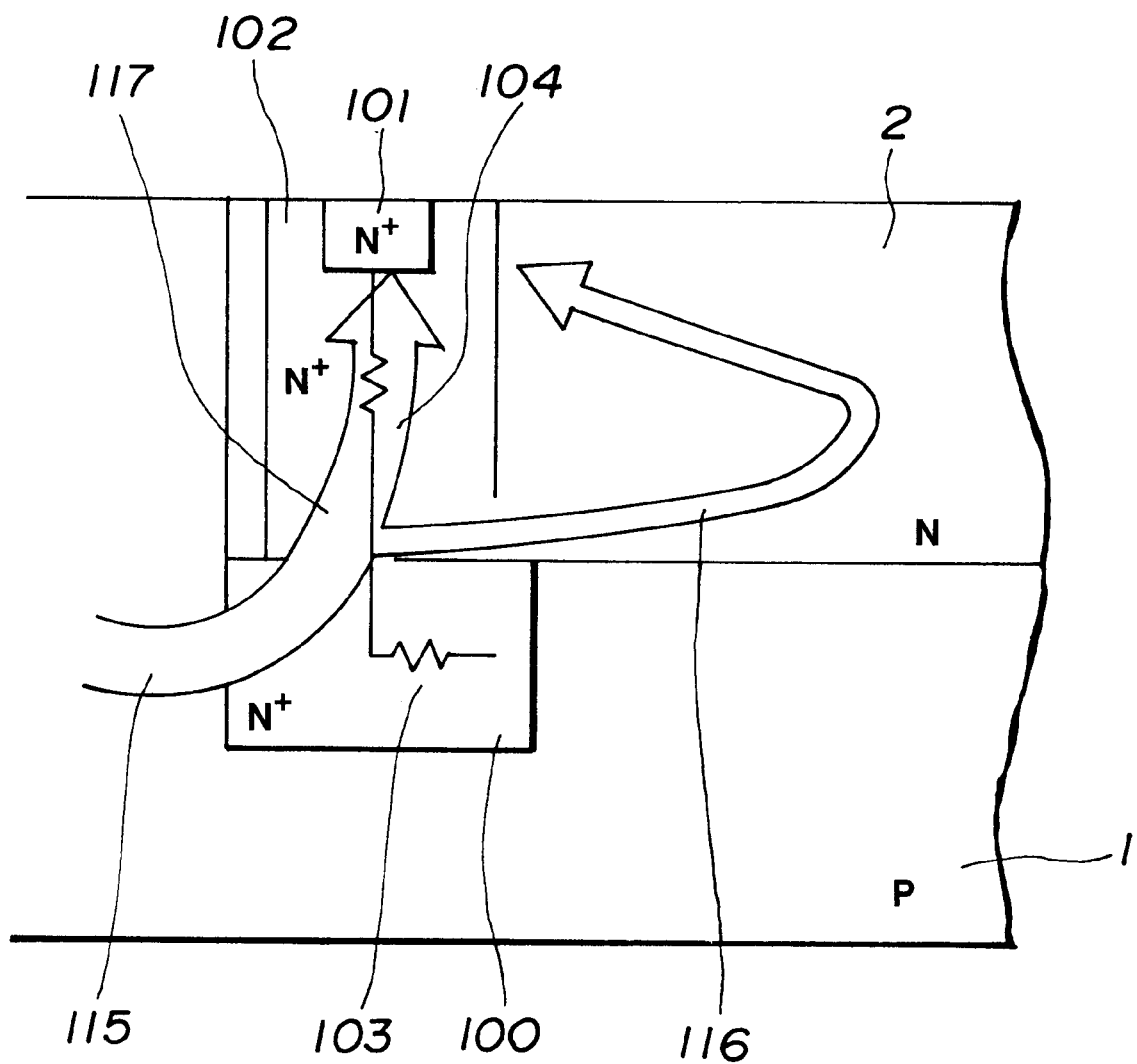
FIG. 4 is an enlarged fragmentary view of FIG. 3, with electron fluxes.

The positional relationship between the PNP bipolar transistor 105 and the pull-down diode 111 in the protective element 15 is established as shown in FIG. 3. The pull-down diode 111 has an anode connected to a P+ substrate contact 110. An NPN bipolar transistor 112 is formed having an emitter corresponding to a cathode of the pull-down diode 111, a base corresponding to the P-type semiconductor substrate 1, and a collector corresponding to the N-well 2.

The operation of the first embodiment will be described when excessive negative ESD voltage is applied to the input/output terminal 12. As soon as the pull-down diode 111 is biased in the forward direction, an emitter-base junction of the NPN bipolar transistor 112 is turned on to inject electrons into the P-type semiconductor substrate 1. Since the pull-down diode 111 and the N-well 2 are formed in the vicinity of the principal surface of the P-type semiconductor substrate 1, the NPN bipolar transistor 112 is also formed in the vicinity of the principal surface of the P-type semiconductor substrate 1. Therefore, referring to FIG. 4, most of an electron flux 115 due to the NPN bipolar transistor 112 is injected into the side of the N-well 2 and that of the N+ buried region 100.

Since the resistances 103, 104 have small values, most of the electron flux 115, i.e. an electron flux 117, passes through the resistances 103, 104. Therefore, an electron flux 116 passing through the N-well 2 corresponds to only part of the electron flux 115. This results in practically little occurrence of a potential difference between the resistances 103, 104, nor occurrence of a voltage gradient in the N-well 2. Therefore, PNP bipolar transistor 105 is not turned on, resulting in sufficiently restrained latchup.

Figure 5:
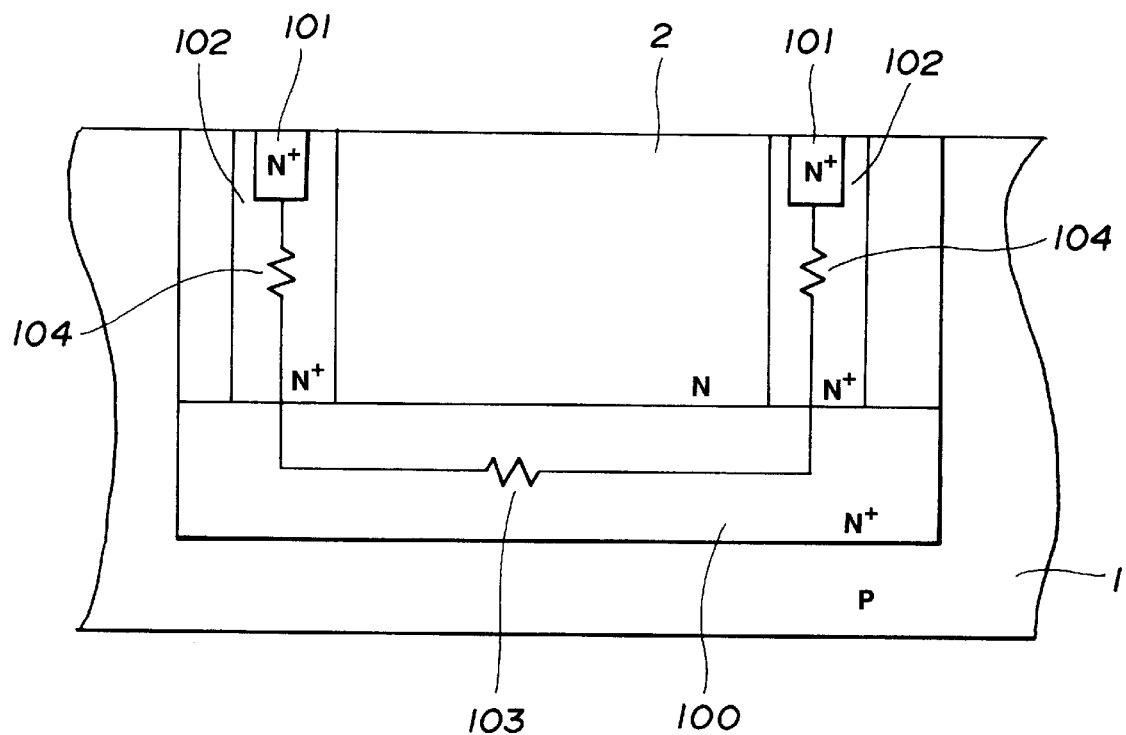
FIG. 5 is a view similar to FIG. 4, showing a side portion of an N-well of the semiconductor device

Referring to FIG. 5, since the resistance 103 has a sufficiently small value, practically no potential difference is produced in the N+ buried region 100. Therefore, practically no potential difference is produced in the side of the N-well 2. Thus, arrangement of the N+ well contacts 101 and the N+ regions 102 only in part of the ends of the N-well 2 allows restraint of potential variations in the N-well 2, resulting in prevented latchup. Moreover, in this case, the areas of the N+ well contacts 101 and the N+ regions 102 are reduced in the principal surface of the N-well 2, having practically no influence on the integration degree of the semiconductor device.

Further, according to the first embodiment, since the N+ buried region 100 is not formed except at the ends of the bottom of the N-well 2, there is no lowering of the current amplification factor $h_{PE}$ of the PNP bipolar transistor 105 which is a parasitic vertical transistor. Therefore, there is no reduction in the capacity of the PNP bipolar transistor 105 to bypass ESD current, resulting in no lowering of the ESD robustness with respect ESD current when ESD voltage is applied to the input/output terminal 12.

Furthermore, due to no existence of the N+ buried region 100 having high concentration of impurities under the PchMOSFET 5, the high-temperature treatment of the semiconductor device during a fabrication process does not produce upward diffusion of the impurities in the N+ buried region 100 to increase the concentration of impurities in the principal surface of the N-well 2 in which the PchMOSFET 5 is formed. This results in no deterioration of the transistor characteristic of the PchMOSFET 5. Moreover, the semiconductor device does not need complicate and difficult fabrication process with respect to restraint of upward diffusion of the impurities in the N+ buried region 100, control of the surface temperature of the N-well 2, etc.

Still further, as described above, the electron flux 115 which causes latchup is injected into the side of the N-well 2 through the protective element 15 and the P-type semiconductor substrate 1 in the vicinity of the principal surface thereof. Therefore, if the N+ buried region 100, the N+ well contacts 101, and the N+ regions 102 are formed at the ends of the bottom of the N-well 2, but not adjacent to the NchMOSFET 4, or if the three are formed at the ends of the bottom of the N-well 2, and at least adjacent to the protective element 15, the semiconductor device can obtain sufficiently high latchup immunity. Moreover, due to reduced areas of the N+ buried region 100, the N+ well contacts 101, and the N+ regions 102, the first embodiment has practically no influence on the integration degree of the semiconductor device.

It is noted that the N+ buried region 100 may discontinuously be formed at the ends of the bottom of the N-well 2. This variant produces the same effects as those of the first embodiment, and has less influence on the integration degree of the semiconductor device.

In such a way, according to the first embodiment, a CMOS formed in the P-type semiconductor substrate 1 has a structure such that the N+ buried region 100 is arranged in part or at the ends of the bottom of the N-well 2 in which the PchMOSFET 5 is formed, producing the effect of sufficiently restrained latchup without decreasing the ESD robustness with respect to ESD current.

Further, if an increase in the area of the N+ well contacts 101 allows a sufficient decrease in a resistance between the N+ well contacts 101 and the N+ buried region 100, the same effect is produced without forming the N+ regions 102.

Furthermore, the gate-electrode structure of the PchMOSFET 5 may be either of the straight and stripe types which produce the quite same effect.

Figure 6:
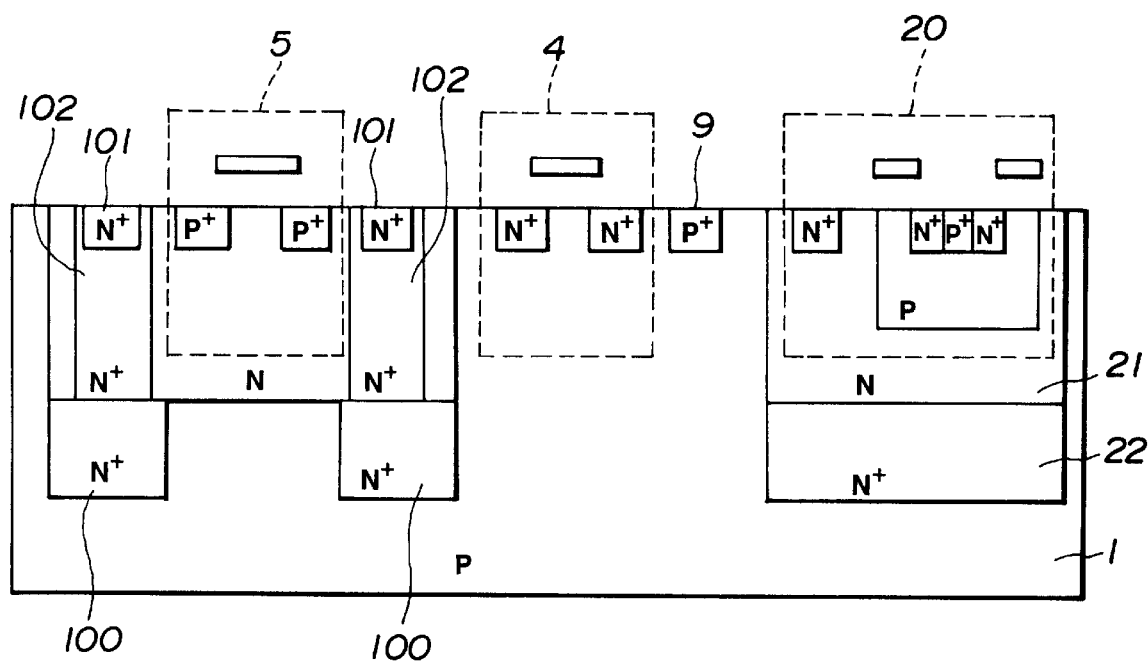
FIG. 6 is a view similar to FIG. 3, showing a second embodiment of the present invention.

FIG. 6 shows a second embodiment of the present invention which is substantially the same as the first embodiment except the following. An N-well 21 is formed in the principal surface of the P-type semiconductor substrate 1. Formed in the principal surface of the N-well 21 is a lateral power transistor 20 having a source, a gate, and a drain arranged on the same plane. Arranged to the bottom of the N-well 21 is an N+ buried region 22 electrically connected to the drain of the lateral power transistor 20. The lateral power transistor 20, the NchMOSFET 4, and the PchMOSFET 5 constitute an intelligent power device (IPD).

The second embodiment produces not only all the effects of the first embodiment, but the following effects:

First, when forming the N+ buried region 22 together with the N+ buried region 100, an increase in the concentration of impurities therein to reduce a on-resistance of the lateral power transistor 20 does not have a bad influence on the transistor characteristic of the PchMOSFET 5. This allows both reduced on-resistance of the lateral power transistor 20 and increased latchup immunity of the control circuit. Moreover, this makes a special fabrication process for forming the N+ buried region 100 unnecessary.

Second, when a new N+ region, not shown, is arranged between the drain of the lateral power transistor 20 and the N+ buried region 22 to reduce the on-resistance of the lateral power transistor 20, the new N+ region can be formed together with the N+ regions 102 without needing a special fabrication process for forming the new N+ region.

In such a way, when the CMOS constitutes an IPD, and the N+ buried region also serves as part of the power transistor in the IPD, the concentration of impurities can be increased in the N+ buried region without degrading the transistor characteristic of the PchMOSFET, resulting in increased latchup immunity of the IPD, and decreased on-resistance of the power transistor.

Figure 7:
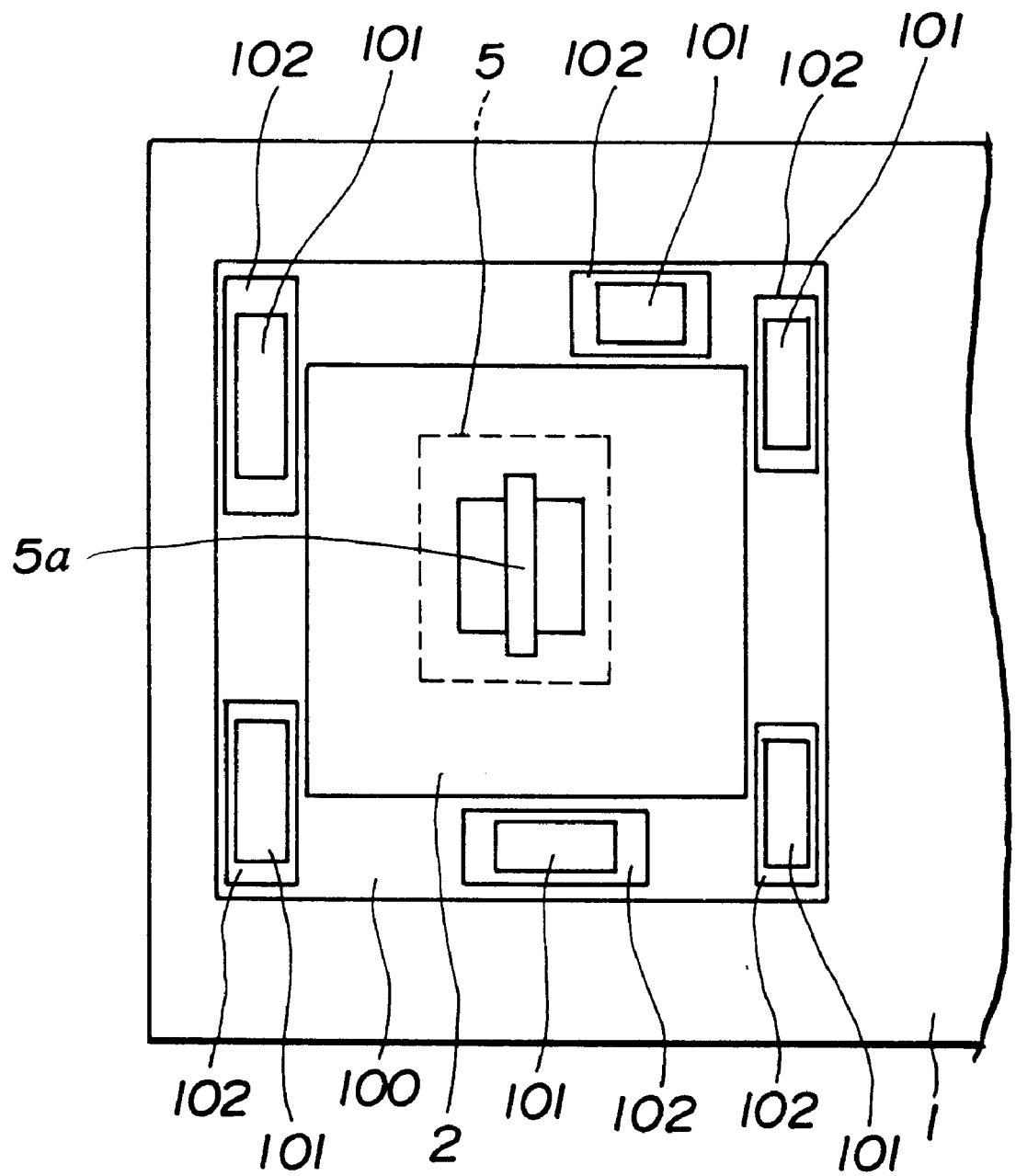
FIG. 7 is a fragmentary view showing a third embodiment of the present invention.

FIG. 7 shows a third embodiment of the present invention which is substantially the same as the first embodiment except that the N+ buried region 100 is arranged to part or most of the bottom of the N-well 2 under the PchMOSFET 5 except the region in which the inversion layer thereof is formed, the N+ regions 102 being arranged each between the N+ buried region 100 and the N+ well contact 101. Note that the region in which the inversion layer is formed lies on the surface of the substrate 1 under the gate electrode 5a of the PchMOSFET 5 and between the drain and source thereof.

The third embodiment produces not only all the effects of the first and second embodiments, but the effect that an increase in the degree of freedom of a layout of the N+ buried region 100 contributes to a decrease in an influence on the integration degree of the semiconductor device, and thus to high integration of the semiconductor device without increasing the area thereof.

Having described the present invention in connection with the preferred embodiments, it is noted that the present invention is not limited thereto, and various changes and modifications can be made without departing from the scope of the present invention. By way of example, in place of the P-type semiconductor substrate, the present invention can be applied to an N-type semiconductor substrate by replacing N with P, and the Vdd terminal with the Vss terminal and vice versa in the above embodiments.

What is claimed is:

1. A semiconductor device comprising:
   a substrate of a first conductivity type, said substrate having a surface;
   a well of a second conductivity type formed in said surface of said substrate, said well having a surface and a bottom;
   a first MOSFET formed in said substrate;
   a second MOSFET formed in said well, said second MOSFET cooperating with said first MOSFET to constitute a CMOS circuit;
   a first region of said second conductivity type formed in said well, said first region
      extending from said surface of said well to said bottom of said well,
      having an impurity concentration higher than that of said well, and
      being connected to a predetermined power source; and
   a second region of said second conductivity type formed under said bottom of said well, said second region
      being electrically connected to said first region,
      having an impurity concentration higher than that of said well, and
      underlying only part of said bottom of said well.

2. A semiconductor device as claimed in claim 1, wherein each of said first and second MOSFETs has a source, a gate, and a drain, with the sources and drains of said each of said first and second MOSFETs formed in the substrate on a first common plane, and the gates of said each of said first and second MOSFETs formed on the substrate on a second common plane.

3. A semiconductor device as claimed in claim 2, wherein said second region is arranged at a peripheral portion of said bottom of said well.

4. A semiconductor device as claimed in claim 2, wherein said second region is formed continuously.

5. A semiconductor device as claimed in claim 2, wherein said second region is formed discontinuously.

6. A semiconductor device as claimed in claim 2, wherein said second region is disposed apart from said first MOSFET.

7. A semiconductor device as claimed in claim 2, wherein said second region is adjacent to a protective element.

8. A semiconductor device as claimed in claim 1, further comprising a contact formed in said first region.

9. A semiconductor device as claimed in claim 1, further comprising a power transistor formed in said substrate.

10. A semiconductor device as claimed in claim 1, wherein said predetermined power source corresponds to a Vdd terminal when said first conductivity type is P, and said second conductivity type is N.

11. A semiconductor device as claimed in claim 1, wherein said predetermined power source corresponds to a Vss terminal when said first conductivity type is N, and said second conductivity type is P.

12. A semiconductor device as claimed in claim 1, wherein said second region underlies said bottom of said well except at least a portion of said bottom under a channel of said second MOSFET.

13. A semiconductor device, comprising:
   a substrate of a first conductivity type, said substrate having a surface;
   a well of a second conductivity type formed in said surface of said substrate, said well having a surface and a bottom;
   a first MOSFET formed in with said substrate;
   a second MOSFET formed in said well, said second MOSFET cooperating with said first MOSFET to constitute a CMOS circuit;
   a first region of said second conductivity type formed in said well, said first region
      extending from said surface of said well to said bottom of said well, having an impurity concentration higher than that of said well, and being connected to a predetermined power source;

a second region of said second conductivity type formed under said bottom of said well, said second region being electrically connected to said first region, having an impurity concentration higher than that of said well, and covering less than all of said bottom of said well; and a contact arranged with said first region.

* * * * *